MANUFACTURING PROCESS OF GALLIUM-ARSENIDE TUNNEL-DIODES

Filed Oct. 2, 1967

INVENTORS:
Nicole M. PUYCHEVRIER
and Maurice J. MENORET
BY Abraham A. Saffitz
ATTORNEY United States Patent Office 3,481,032
Patented Dec. 2, 1969

3,481,032

MANUFACTURING PROCESS OF GALLIUM-ARSENIDE TUNNEL-DIODES

Nicole M. Puychevrier, 15 Avenue des Ecoles, Wissous, and Maurice J. Menoret, 12 Avenue de Verdun, Chatillon-sous-Bagneux, France Filed Oct. 2, 1967, Ser. No. 672,195
Claims priority, application France, Oct. 3, 1966, 78,583
Int. Cl. B01j *17/00;* H01l *7/18*
U.S. Cl. 29—584 1 Claim

ABSTRACT OF THE DISCLOSURE

The process disclosed comprises essentially the steps of driving in the air a wire of galvanized copper into touch with an N-type heavily doped gallium-arsenide wafer, applying to the assembly of the wafer and the wire the voltage of a source the positive terminal of which is connected to the wafer and the negative terminal to the wire and stopping said application when the intensity of the current provided by the source reaches a given value.

Figure 1:
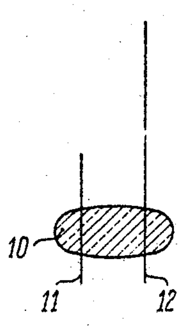

This invention relates to the fabrication of gallium-arsenide tunnel-diodes.

It is known that the characteristic curve of the current versus voltage of a gallium-arsenide diode has a shape similar to the same characteristic curve of a germanium diode, but that the voltages $V_p$ and $V_v$ corresponding respectively to the peak-current and the valley-current are higher for the gallium-arsenide diode than for the germanium diode.

The same values of the peak and valley currents may be readily obtained for both diodes, for example:

$$I_p=10 \text{ ma.} \quad I_v=2 \text{ ma.}$$

but these current values wil be reached for voltage values such as:

$$V_p=70 \text{ mv.} \quad V_v=300 \text{ mv.}$$

for a germanium diode and $$V_p=160 \text{ mv.} \quad V_v=700 \text{ mv.}$$

for a gallium-arsenide diode.

The voltages $V_p$ and $V_v$ of a gallium-arsenide diode are then two to three times larger than for a germanium diode.

Such values of the voltages $V_p$ and $V_v$ are particularly suitable for electronic circuits such as the control circuits for blocking or saturating NPN type transistors.

The object of the invention is to provide a manufacturing process allowing to obtain, at relatively low cost price, gallium-arsenide diodes having electrical characteristics readily and accurately reproducible.

A manufacturing process for germanium tunnel-diodes and backward-diodes is known from the French Patent 1,334,356 filed May 28, 1962 and its first addition 85,366 filed Dec. 31, 1963. This process comprises the steps of driving in the air an aluminium wire into touch with an N-type germanium wafer suitably doped, applying to the assembly of the wafer and the wire the voltage of a source the positive terminal of which being connected to the wafer and the negative terminal to the wire and stopping said application when the intensity of the current provided by the source reaches a given value.

The present invention takes the above mentioned process as a pattern to adapt the same at the different case of a gallium-arsenide diode.

According to the invention a manufacturing process of gallium-arsenide tunnel-diodes comprises the steps of driving, in the air, a galvanized copper wire into touch with an N-type heavily doped gallium-arsenide wafer, applying to the assembly of the wafer and the wire the voltage of a source the positive terminal of which being connected to the wafer and the negative terminal to the wire and stopping said application when the intensity of the current provided by said source reaches a given value.

A fundamental difference in respect to the above mentioned French patent and addition is afforded by the fact that the wire soldered to the semiconductor wafer is a galvanized copper wire the zinc coating of which constitutes the P-type impurity required for the formation of the junction of the diode.

In order to obtain diodes having substantially the same electrical characteristics, the soldering parameters must remain unimpaired during successive manufacturing operations. For this purpose, the source employed is preferably a generator providing current pulses of accurately determined amplitude and duration. It is advantageous, for example, to employ a soldering set such as described in the paper entitled "Diodes tunnel de technologie simple pour mémoires rapides" by the present applicants, M. Boulet et M. Lebail and published in the "Colloque International sur la Technique des Mémoires," Paris, Avril 1965 (Ed. Chiron, Paris 1965, pages 341 to 352).

Figure 2:
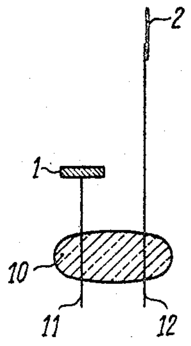
Figure 3:
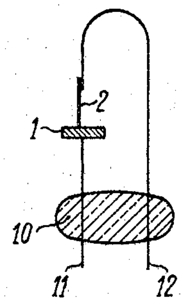

The invention will be understood more clearly and fully from a perusal of the following detailed description with reference to the accompanying drawing in which:

FIGS. 1 to 3 are schematic diagrams illustrating three successive steps of the process of the invention, preceding the soldering operation, for manufacturing gallium-arsenide tunnel-diodes.

The basic material is gallium-arsenide body heavily doped with n-type impurities such as selenium, the concentration of said impurities being about $10^{19}$ atoms per $cm.^3$. Said gallium-arsenide body being sliced up into wafers 0.5 mm. thick, said wafers are etched in a bath of methyl alcohol and bromine, then rinsed in methyl alcohol and divided into little pellets.

As illustrated by FIG. 1, two copper wires 11 and 12 of different lengths are welded into a glass bead having a diameter as of 5 mm.

As illustrated by FIG. 2 a gallium-arsenide pellet 1 doped and prepared as explained hereinbefore is soldered to the shorter wire 11 with a tin-lead solder, and a galvanized copper wire 2 is soldered to the longer wire 12.

As shown in FIG. 3 the wire 12 is bent so as to drive the free end of the galvanized copper wire 2 into touch with the large free face of the pellet 1.

An electric pulse of suitable polarity, amplitude and duration is then applied between the wires 11 and 12 so as to strike a spark between wire 2 and pellet 1, the soldering of which form the junction of the diode.

The soldering thus obtained is then protected by a suitable varnish and the diode is encapsulated in known manner.

What we claim is:

1. A manufacturing process for gallium-arsenide tunnel-diodes comprising essentially the steps of driving in the air a galvanized-copper wire into touch with an N-type gallium-arsenide wafer having a significant impurities concentration of about $10^{19}$ atoms/cm.$^3$ and a thickness of about 0.5 millimeter, applying to the assembly of the wafer and the wire the voltage of a source the positive terminal of which is connected to the wafer and the negative terminal to the wire; and stopping said application when the current provided by the source reaches a given intensity which is specific of the soldering of said galvanized-copper wire to said wafer with formation of a P-N junction due to the zinc coating of said wire.

References Cited

UNITED STATES PATENTS

| | | | |
|---|---|---|---|
| 2,586,609 | 2/1952 | Burke | 29—588 |
| 2,646,536 | 7/1953 | Benzer et al. | 29—584 |
| 2,894,184 | 7/1959 | Veach et al. | 29—584 |

PAUL M. COHEN, Primary Examiner

U.S. Cl. X.R.

29—576, 588